(12) United States Patent
Wieczorek et al.

(10) Patent No.: US 7,955,937 B2
(45) Date of Patent: Jun. 7, 2011

(54) METHOD FOR MANUFACTURING SEMICONDUCTOR DEVICE COMPRISING SOI TRANSISTORS AND BULK TRANSISTORS

(75) Inventors: Karsten Wieczorek, Dresden (DE); Manfred Horstmann, Duerroehrsdorf-Dittersbach (DE); Thomas Feudel, Radebeul (DE); Thomas Heller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 327 days.

(21) Appl. No.: 11/560,896

(22) Filed: Nov. 17, 2006

(65) Prior Publication Data

US 2007/0228377 A1    Oct. 4, 2007

(30) Foreign Application Priority Data

Mar. 31, 2006    (DE) .......................... 10 2006 015 076

(51) Int. Cl.
*H01L 21/331*    (2006.01)
(52) U.S. Cl. ........ 438/311; 438/455; 438/481; 257/347; 257/E21.09; 257/E21.32
(58) Field of Classification Search .................. 438/152, 438/311, 478–487, 496, 455; 257/67, 347, 257/E27.112, E21.32, E21.545, E21.561, 257/E21.09
See application file for complete search history.

(56) References Cited

U.S. PATENT DOCUMENTS

| | | | |
|---|---|---|---|
| 5,529,947 A | 6/1996 | Okonogi | 437/62 |
| 5,894,152 A | 4/1999 | Jaso et al. | 257/347 |
| 6,140,210 A * | 10/2000 | Aga et al. | 438/458 |
| 6,214,653 B1 | 4/2001 | Chen et al. | 438/153 |
| 6,429,488 B2 | 8/2002 | Leobandung et al. | 257/354 |
| 6,756,257 B2 | 6/2004 | Davari et al. | 438/151 |
| 6,884,694 B2 * | 4/2005 | Park et al. | 438/455 |
| 6,906,384 B2 * | 6/2005 | Yamada et al. | 257/347 |
| 7,274,072 B2 * | 9/2007 | Chang et al. | 257/368 |
| 7,605,429 B2 * | 10/2009 | Bernstein et al. | 257/347 |
| 2003/0146488 A1 | 8/2003 | Nagano et al. | 257/506 |
| 2003/0151112 A1* | 8/2003 | Yamada et al. | 257/510 |
| 2003/0201512 A1 | 10/2003 | Yamada et al. | 257/510 |
| 2004/0026739 A1 | 2/2004 | Sato et al. | 257/347 |
| 2004/0150044 A1* | 8/2004 | Nagano et al. | 257/347 |
| 2004/0183131 A1* | 9/2004 | Nagano et al. | 257/347 |
| 2004/0195626 A1* | 10/2004 | Yamada et al. | 257/347 |

(Continued)

FOREIGN PATENT DOCUMENTS

EP    0701286    3/1996

(Continued)

OTHER PUBLICATIONS

"High Performance CMOS Fabricated on Hybrid Substrate with Different Crystal Orientations" by Yang, et al; 2003.

(Continued)

*Primary Examiner* — Khiem D Nguyen
(74) *Attorney, Agent, or Firm* — Williams, Morgan & Amerson, P.C.

(57) ABSTRACT

By forming bulk-like transistors in sensitive RAM areas of otherwise SOI-based CMOS circuits, a significant savings in valuable chip area may be achieved since the RAM areas may be formed on the basis of a bulk transistor configuration, thereby eliminating hysteresis effects that may typically be taken into consideration by providing transistors of increased transistor width or by providing body ties. Hence, the benefit of high switching speed may be maintained in speed-critical circuitry, such as CPU cores, while at the same time the RAM circuit may be formed in a highly space-efficient manner.

7 Claims, 6 Drawing Sheets

U.S. PATENT DOCUMENTS

| | | | |
|---|---|---|---|
| 2005/0019999 A1* | 1/2005 | Yamada et al. | 438/197 |
| 2005/0121722 A1* | 6/2005 | Oyamatsu | 257/347 |
| 2005/0189610 A1 | 9/2005 | Usuda et al. | 257/510 |
| 2005/0191797 A1* | 9/2005 | Usuda et al. | 438/152 |
| 2006/0043494 A1 | 3/2006 | Ipposhi et al. | 257/369 |

FOREIGN PATENT DOCUMENTS

| | | | |
|---|---|---|---|
| FR | 2 878 372 | 12/2005 | 21/762 |

OTHER PUBLICATIONS

PCT Search Report Dated Aug. 30, 2007 for Serial No. PCT/US07/007705.

Translation of Official Communication from German Patent Office for German Patent Application No. 10 2006 015 076.7 dated Dec. 7, 2009.

* cited by examiner

METHOD FOR MANUFACTURING SEMICONDUCTOR DEVICE COMPRISING SOI TRANSISTORS AND BULK TRANSISTORS

BACKGROUND OF THE INVENTION

1. Field of the Invention

Generally, the present invention relates to the formation of integrated circuits, and, more particularly, to the formation of field effect transistors in complex circuits including a high speed logic circuitry and functional blocks with less speed-critical behavior, such as a memory area, for instance in the form of a cache memory of a CPU.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

In view of the former aspect, in addition to other advantages, the silicon-on-insulator (SOI) architecture has been continuously gaining in importance for manufacturing MOS transistors, due to their characteristics of a reduced parasitic capacitance of the PN junctions, thereby allowing higher switching speeds compared to bulk transistors. In SOI transistors, the semiconductor region, in which the drain and source regions as well as the channel region are provided, also referred to as body, is dielectrically encapsulated, which provides significant advantages which, however, also gives rise to a plurality of issues. Contrary to the body of bulk devices, which is electrically connected to the substrate and thus applying a specified potential to the substrate maintains the bodies of bulk transistors at a specified potential, the body of SOI transistors is not connected to a specified reference potential, and, hence, the body's potential may usually float, due to accumulating minority charge carriers, thereby leading to a variation of the threshold voltage Vt of the transistors, which may also be referred to as hysteresis. In particular, for static memory cells, the threshold variation may result in significant instabilities of the cell, which may not be tolerable in view of data integrity of the memory cell. Consequently, in conventional SOI devices including memory blocks, the drive current fluctuations associated with the threshold voltage variations are taken into consideration by appropriate design measures in order to provide a sufficiently high drive current range of the SOI transistors in the memory block. Hence, the respective SOI transistors in the memory block are typically formed with a sufficiently large width so as to provide the required drive current margins, thereby requiring a moderately high amount of chip area. Similarly, other design measures for eliminating threshold fluctuations caused by the floating body potential, for instance so-called body ties, are a very space-consuming solution and may not be desirable for highly scaled and complex semiconductor devices including extended RAM areas.

In view of the above-described situation, there exists a need for an alternative technique that enables the formation of advanced SOI devices in critical functional blocks while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that aims at reducing the required floor space in advanced integrated circuits having time-critical functional circuit blocks formed on the basis of an SOI architecture and also device areas with increased sensitivity to hysteresis effects, such as static RAM areas and the like. For this purpose, transistors within sensitive device areas, such as cache areas or other memory areas, and device regions of less critical speed requirements may be formed on the basis of a bulk-like transistor architecture, while, in other areas, the SOI architecture may still be used, thereby providing the potential for substantially eliminating fluctuations in the threshold voltage of the bulk-like devices, which may otherwise be caused by a floating body potential. Consequently, the bulk-like transistors may be provided with reduced dimensions compared to equivalent SOI transistors, since the drive current capabilities of these devices, contrary to the SOI transistors, may be determined without having to take into consideration hysteresis effects.

According to one illustrative embodiment of the present invention, a method comprises forming a first crystalline semiconductor region on an insulating layer located above a substrate. The method further comprises forming a second crystalline semiconductor region adjacent to the first crystalline semiconductor region, wherein the second crystalline semiconductor region connects to the substrate. A first plurality of transistors is formed in and on the first crystalline semiconductor region and a second plurality of transistors is formed in and on the second crystalline semiconductor region.

According to another illustrative embodiment of the present invention, a semiconductor device comprises a first crystalline semiconductor region formed on an insulating layer that is formed above a substrate. A second crystalline semiconductor region is formed laterally adjacent to the first crystalline semiconductor region and connects to the substrate. Furthermore, a first plurality of field effect transistors is formed in and on the first crystalline semiconductor region and a second plurality of field effect transistors is formed in and on the second crystalline semiconductor region.

BRIEF DESCRIPTION OF THE DRAWINGS

The invention may be understood by reference to the following description taken in conjunction with the accompanying drawings, in which like reference numerals identify like elements, and in which.

Figure 1A:
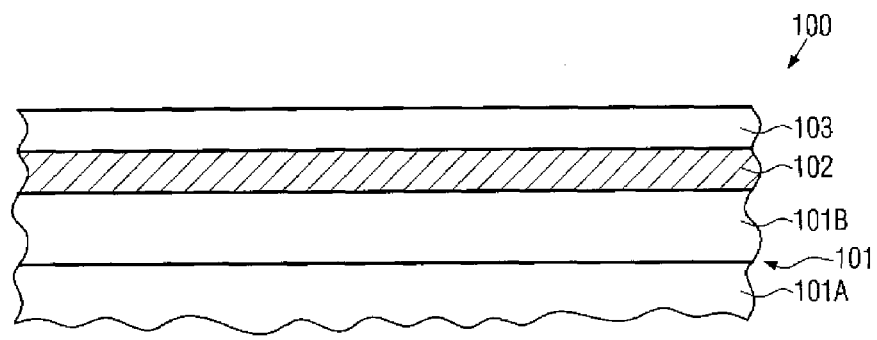
FIGS. 1a-1f schematically illustrate cross-sectional views of a semiconductor device during various manufacturing stages for forming SOI-like transistors and bulk transistors in adjacent device regions starting from an SOI substrate and re-growing relevant portions of a semiconductor material on the basis of a crystalline portion of the substrate according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for forming SOI transistors and bulk transistors commonly in a single substrate, wherein the bulk devices may represent functional circuit blocks of increased sensitivity to hysteresis effects, i.e., to variations in the threshold voltage of respective field effect transistors caused by charge carrier accumulation in the transistor body of non-tied SOI transistors, thereby providing enhanced device stability, without requiring additional body ties or greatly increased transistor width to provide increased drive current capability margins. Consequently, in critical circuit blocks, such as CPU cores, combinatorial logic blocks and the like, the transistors may be provided in an SOI architecture, thereby obtaining the advantages of an SOI configuration, that is, high switching speed due to reduced parasitic capacitances, while, on the other hand, in sensitive device areas, such as static RAM areas, cache areas and the like, a significant reduction of chip area occupied by the circuitry may be achieved compared to conventional overall advanced SOI devices. For this purpose, respective device regions may be formed on the basis of highly efficient manufacturing techniques, in which respective buried insulating layers, such as buried oxides and the like, may be formed with desired characteristics while, additionally, respective bulk regions may be formed, wherein, in some illustrative embodiments, it may be started by a standard SOI substrate, whereas, in other illustrative embodiments, advanced implantation or wafer bonding techniques may be used to provide a respective SOI/bulk substrate.

With reference to FIGS. 1a-1g, 2a-2d, 3a,-3b and 4a-4c further illustrative embodiments of the present invention will now be described in more detail. FIG. 1a schematically illustrates a semiconductor device 100 in cross-sectional view at an early manufacturing stage. The device 100 comprises a substrate 101, which may represent any appropriate substrate, such as a bulk semiconductor substrate, for instance a silicon substrate, or any other semiconductor substrate. The substrate 101 may, in some illustrative embodiments, include a base portion 101A which may have any configuration and which may, for instance, be comprised of an insulating material, a semiconductor material and the like, while an upper portion 101B may be formed of a substantially crystalline semiconductor material, such as silicon, silicon/germanium, silicon/carbon or any other appropriate semiconductor material. As will be explained more fully below, the substrate 101, i.e., at least the portion 101B thereof, may be used as a crystalline template for the formation of a respective crystalline semiconductor region at specified areas of the device 100, which may, in some embodiments, receive field effect transistors for forming memory areas. Consequently, depending on the desired characteristics of the respective semiconductor regions to be formed on the basis of the upper portion 101B, corresponding crystalline characteristics may be provided for the portion 101B, for instance in terms of crystal orientation, lattice spacing and the like. For example, if a specific crystalline orientation is desired for the bulk semiconductor region to be formed on the basis of the upper portion 101B, a respective crystalline orientation may be provided for the portion 101B.

The device 100 may further comprise a buried insulating layer 102 which may be comprised of any appropriate insulating material, such as silicon dioxide, silicon nitride or other materials providing the required characteristics for the formation of highly advanced SOI transistor elements in specific areas of the device 100, as will be described later on. Furthermore, a crystalline semiconductor layer 103 is formed on the buried insulating layer 102, wherein the semiconductor layer 103 may have characteristics as are desired for SOI transistors to be formed on specified areas of the device 100. For instance, the material composition, the crystalline orientation, the thickness and the like of the semiconductor layer 103 may be selected in accordance with device requirements for advanced SOI transistors. In some illustrative embodiments, the semiconductor layer 103 may be comprised of silicon, which may include a certain amount of non-silicon atoms, such as carbon, germanium and the like, depending on further process and device requirements.

Typically, the semiconductor device 100 as shown in FIG. 1a may be formed on the basis of well-established techniques, including wafer bond techniques, advanced SIMOX implantation techniques and the like.

Figure 1B:
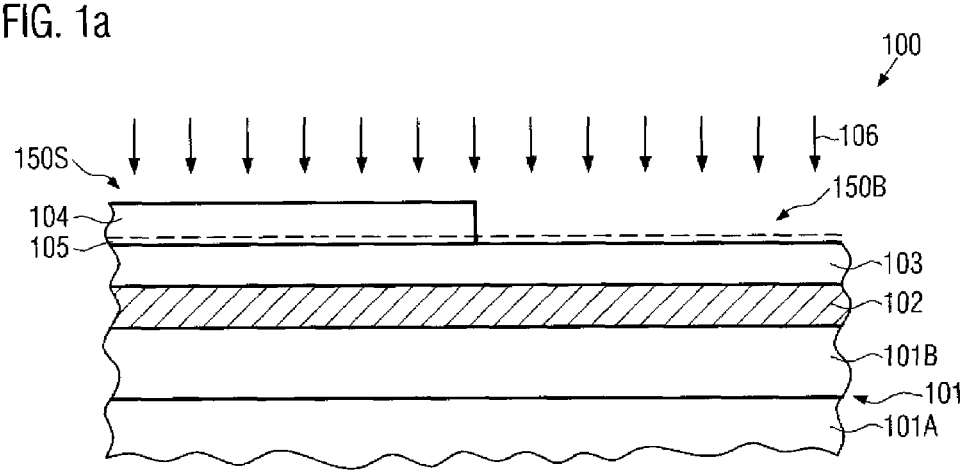

FIG. 1b schematically illustrates the device 100 in a further advanced manufacturing stage. The device may comprise a mask 104, e.g., a hard mask layer, covering a device region 150S that is intended to act as an SOI region for the formation of corresponding SOI transistors, while exposing a region 150B, which is to receive a respective crystalline semi-conductor material connecting to the substrate 101, i.e., at least to the upper portion 101B thereof. The mask 104 may be comprised of any appropriate material, such as silicon nitride, silicon dioxide or other appropriate materials, and material compositions that provide sufficient selectivity during the following processing. In one illustrative embodiment, an optional etch stop layer 105 may be provided, for instance in the form of a material having a high etch selectivity with respect to the material of the mask 104, in order to enhance a patterning of the mask 104 and the removal thereof in a later manufacturing stage. For example, the mask 104 may be comprised of silicon nitride, while the optional etch stop layer 105 may be formed of silicon dioxide.

The mask 104 may be manufactured using the following processes. First, the optional etch stop layer 105, if provided, may be formed, for instance, by oxidation and/or deposition on the basis of well-established deposition techniques, such as plasma enhanced chemical vapor deposition (PECVD) and the like. Thereafter, a material layer may be deposited, for instance on the basis of PECVD, with a required thickness and characteristic desired for the mask 104. Thereafter, the material layer may be patterned on the basis of a lithography process, for instance by forming a respective resist mask and etching the material layer using the resist mask as an etch mask. Thereafter, the resist mask may be removed and the device 100 may be exposed to a further etch ambient 106 for removing an exposed portion of the layer 105, if provided, and to etch through the layers 103 and 102. For example, in a first step of the etch process 106, possibly after removing the optional etch stop layer 105, it may be etched through the semiconductor layer 103, wherein selective etch chemistries may be used in order to reliably stop the etch process in and on the buried insulating layer 102. In this way, a highly controllable etch process may be established across the entire substrate 101. Thereafter, the etch chemistry may be changed to provide a high etch rate for the material of the buried insulating layer 102 in order to etch down to the upper portion 101B. In some illustrative embodiments, in this etch step, a highly selective etch chemistry with respect to the material of the upper portion 101B may also be selected, which may therefore also provide high controllability and a highly uniform etch result across the entire substrate 101. In other illustrative embodiments, the etch process 106 may be performed on the basis of a non-selective etch chemistry, thereby etching through the layer 103 and the layer 102 in a single etch step. In this case, the end of the etch process 106 may be determined on the basis of endpoint detection or by a predetermined etch time.

Figure 1C:
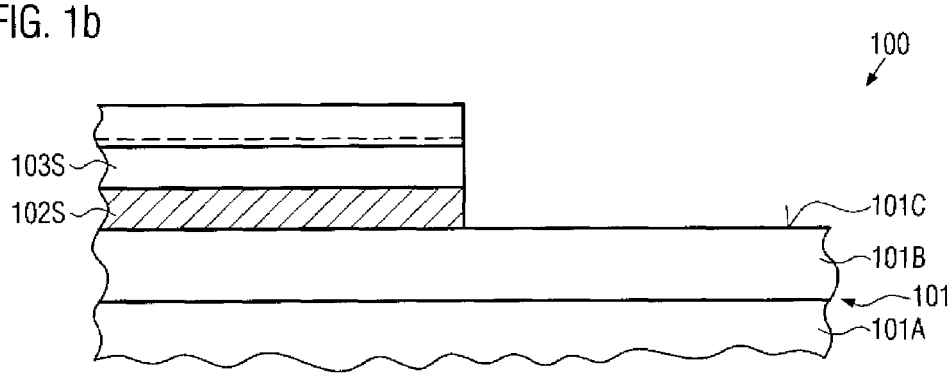

FIG. 1c schematically illustrates the device 100 after the completion of the above-described process sequence and after any cleaning processes for removing contaminants from the exposed surface 101C of the portion 101B in order to prepare the surface 101C for a subsequent epitaxial growth process. In this manufacturing stage, the device 100 comprises a first crystalline semiconductor region 103S, which represents the residue of the crystalline semiconductor layer 103, which is formed above the residue of the buried insulating layer 102, now indicated as 102S, thereby providing an SOI area within the device 100, in and above which respective SOI transistor elements may be formed.

Figure 1D:
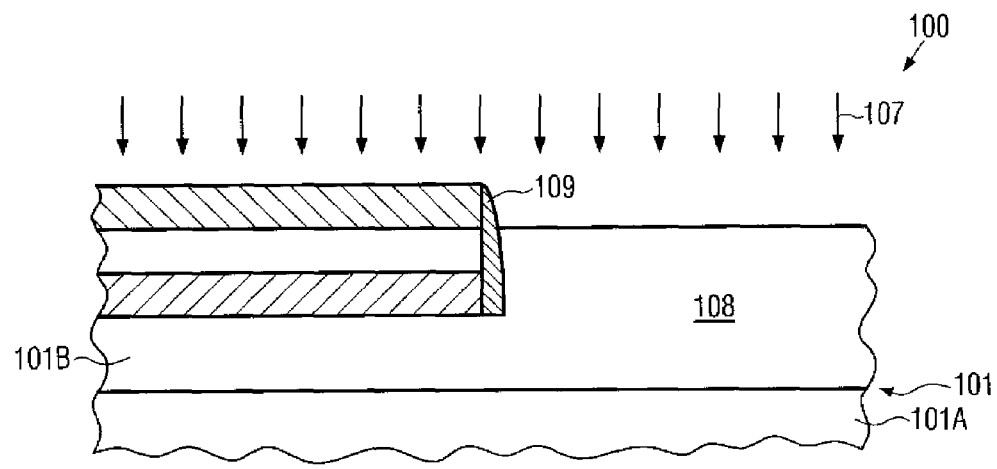

FIG. 1d schematically illustrates the semiconductor device 100 in a further advanced manufacturing stage during a selective epitaxial growth process 107 for selectively forming a second crystalline semiconductor region 108 that connects to the substrate 101, i.e., to the upper portion 101B thereof. In the selective epitaxial growth process 107, respective process parameters, such as pressure, temperature, composition of precursor gases, amount and type of carrier gases and the like, may be selected such that material deposition of the semiconductor material is substantially restricted to the exposed portion of the portion 101B while substantially no material is formed on the mask 104. Consequently, during the process 107, semiconductor material deposits initially on the exposed surface 101C and also adopts the crystalline structure of the surface 101C. After a specific height of the epitaxially grown material is achieved, the process 107 may be discontinued, thereby providing the crystalline region 108, the characteristics of which are substantially determined by the type of material deposited and the crystalline structure of the underlying upper portion 101B. For example, if a different crystallographic orientation is advantageous for the formation of transistor elements in the second crystalline semiconductor region 108, compared to the first crystalline semiconductor region 103S, the portion 101B may be provided with the desired crystallo-graphic orientation. Consequently, in some illustrative embodiments, the provision of the first crystalline semiconductor region 103S and the second crystalline semiconductor region 108 as an SOI region and a bulk region, respectively, may be combined with the provision of different crystalline characteristics of the regions 103S and 108.

In one illustrative embodiment, as also illustrated in FIG. 1d, prior to the epitaxial growth process 107, an optional spacer 109 may be formed on respective exposed sidewalls of the layer stack 102S, 103S and 104S, if the influence of the crystalline material of the semiconductor region 103S during the epitaxial growth process 107 is considered inappropriate. In this case, the spacer 109 may be formed on the basis of any well-established technique including the conformal deposition of an appropriate spacer material, such as silicon nitride, silicon dioxide and the like, which may be subsequently removed from horizontal surface portions. Hence, the semiconductor region 103S may be effectively isolated during the growth process 107.

Figure 1E:
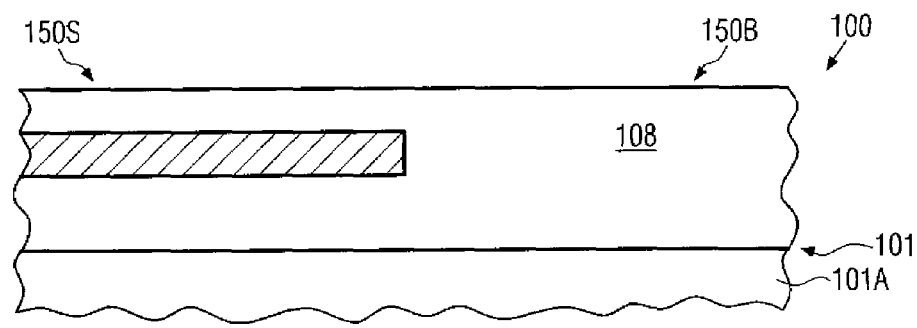

FIG. 1e schematically illustrates the semiconductor device 100 in a further advanced manufacturing stage, in which the mask 104 is removed, thereby exposing the first semiconductor region 103S, thereby providing the SOI region 150S adjacent to the bulk region 150B. The removal of the mask 104 may be accomplished on the basis of highly selective etch processes, as are for instance well established for a plurality of dielectric materials, such as silicon dioxide, silicon nitride and the like, with respect to a silicon-based material, when the first and second semiconductor regions 103S, 108 are substantially comprised of crystalline silicon. For example, silicon nitride may be efficiently removed in a highly selective manner on the basis of hot phosphoric acid without a substantial material removal in the second semiconductor region 108. In other illustrative embodiments, after removing the mask 104, a further planarization process may be performed if the resulting surface topography of the device 100 may be considered insufficient for the further processing. For instance, a chemical mechanical polishing (CMP) process may be performed after the removal of the mask 104, thereby providing a planar surface configuration, as will also be described in more detail later on.

Figure 1F:
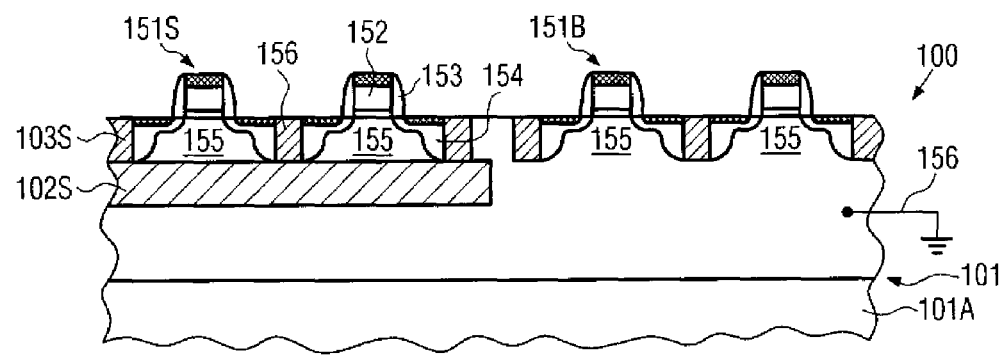

FIG. 1f schematically illustrates the semiconductor device in a further advanced manufacturing stage. Here, a plurality of transistor elements 151S are formed in and on the first semiconductor region 103S, which correspondingly represent transistor elements based on an SOI architecture. On the other hand, a plurality of transistor elements 151B is formed in and on the second semiconductor region 108 thereby providing a bulk-like transistor architecture. The transistors 151S, 151B may be formed in accordance with specific design requirements wherein, as previously explained, the SOI transistors 151S may be formed on the basis of speed considerations, while the transistors 151B may be formed to provide high functional stability at a reduced floor space within the device 100. To this end, well-established manufacturing techniques may be used which may include any sophisticated manufacturing processes for obtaining the desired transistor characteristics. For instance, in highly advanced applications, stress and strain engineering techniques may be incorporated to enhance the performance of transistors, especially the SOI transistors 151S, wherein different strain characteristics may be provided for the transistors 151B. For example, as previously explained, the characteristics of the material of the semiconductor region 108 may differ from the characteristics of the material of the region 103S to even further enhance the corresponding transistor characteristics with respect to the functions in the different device areas 150S and 150B. For instance, in some applications, it may be advantageous to provide the material of the semiconductor region 103S as a strained silicon material, whereas a corresponding strain in the semiconductor region 108 may not be desirable. Consequently, in this case, the material of the region 108 may be grown as a substantially relaxed semiconductor material, such as silicon, by providing a substantially non-strained semiconductor material in the portion 101B of the substrate 101.

It should be appreciated that the transistor configuration shown in FIG. 1f is of illustrative nature only and any appropriate transistor configuration may be adopted. For instance, as illustrated, the transistors 151S and 151B may have respective gate electrodes 152, which, in some embodiments, may have dimensions of approximately 100 nm and significantly less, formed on respective gate insulation layers 153, wherein, for instance, the respective layers may differ between the individual transistor elements and may also differ between the transistors 151S and 151B. Moreover, respective drain and source regions 154 may be formed, thereby enclosing a channel region formed within a body region 155. As previously explained, the body regions 155 of the SOI transistors 151S may be dielectrically encapsulated due to the provision of respective isolation structures 156 and the underlying insulating layer 102S. Consequently, charge carriers, accumulated in the body regions 155 of the SOI transistors 151S, may only be discharged via leakage currents through the drain and source regions 154, unless any body ties are provided, which however would require significant floor space, and thus a certain degree of variation of the floating potential of the bodies 155 may be generated during operation of the transistors. Consequently, a corresponding variation of the respective threshold voltages may be observed, which is also referred to as hysteresis. For time-critical circuit blocks, such as CPU cores or any other time-critical circuitry, the respective hysteresis effect may be tolerated for the benefit of an enhanced switching speed, or certain countermeasures, such as PN junctions of increased leakage, an increased transistor width to compensate for drive current capability loss due to hysteresis effects and the like, may be employed. Contrary to the insulated bodies 155 of the SOI transistors 151S, the body regions 155 of the bulk transistors 151B are electrically connected to at least the upper portion 101B of the substrate 101 due to the direct connection of the semiconductor region 108 to the upper portion 101B. Consequently, similarly to a usual bulk configuration, a desired reference potential 156, such as ground potential, may be applied to the body regions 155 of the bulk transistors 151B. Consequently, in some illustrative embodiments, when the plurality of bulk transistors 151B may represent memory cells, such as static RAM cells, the corresponding memory cells exhibit a high stability, wherein the transistor configuration, i.e., the size in the width direction, may be selected on the basis of drive current requirements of bulk transistors rather than having to meet the requirements for accommodating a large variance of the threshold voltage as would be the case for equivalent SOI transistors, thereby necessitating significantly increased transistor widths in order to provide the required stable operation of memory cells in SOI devices. For example, in some sophisticated applications, up to about 30 percent or even more valuable chip space in the memory area may be saved by using a hybrid configuration, as shown in FIG. 1f, compared to an equivalent SOI device, which may provide the same performance in time-critical functional blocks, such as CPU cores, while the memory block is also provided in SOI technology.

Figure 1G:
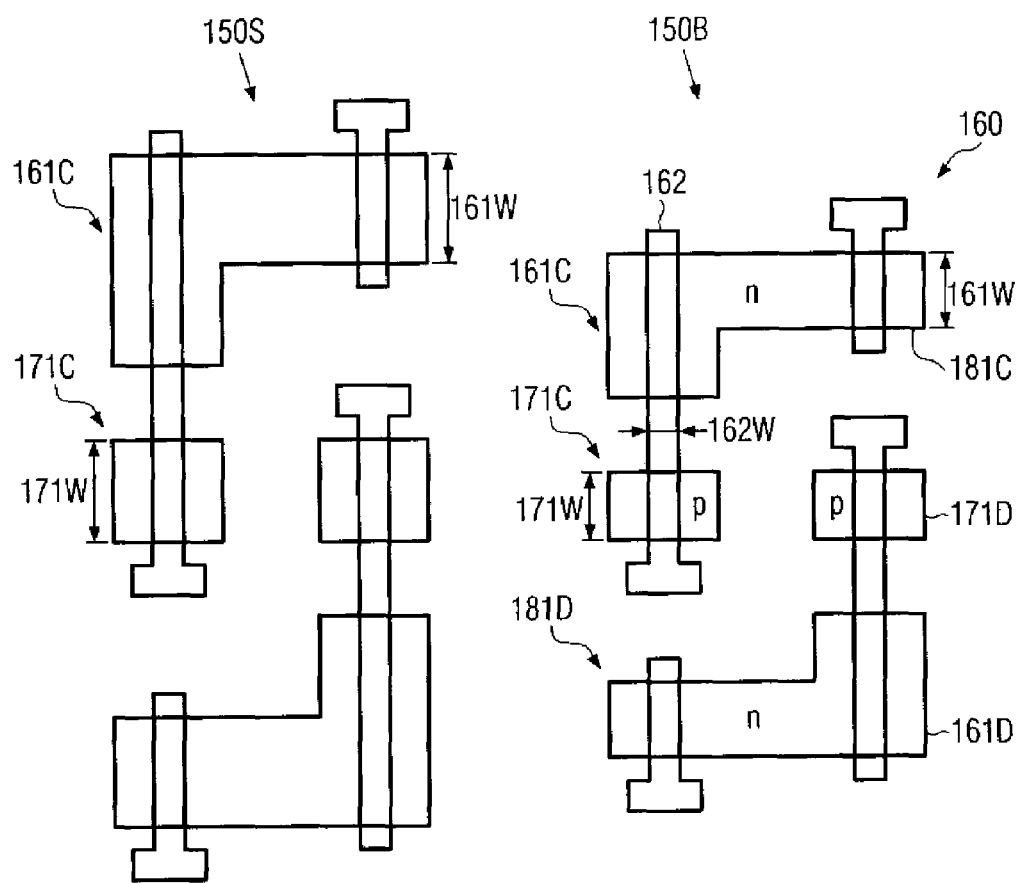
FIG. 1g schematically illustrates a top view of a plurality of transistor elements formed as SOI devices and bulk devices, respectively, wherein the transistor width of the bulk devices may be reduced compared to equivalent SOI devices according to the present invention.

FIG. 1g schematically illustrates two inverter pairs, which may, for instance, be formed in the region 150S and 150B, respectively, wherein, for instance, the corresponding circuits may represent a static RAM cell. It should be appreciated that, in illustrative embodiments, corresponding RAM cells would be substantially formed in the region 150B in order to have a significant space saving. Thus, the circuitry as shown in the region 150S may represent a conventional RAM cell when fabricated in a highly advanced SOI device including time-critical functional blocks, as are, for instance, represented by the plurality of transistors 151S in FIG. 1f.

The RAM cell 160 formed in the bulk region 150B may comprise an N-channel transistor 161C and a P-channel transistor 171C, which may form a respective inverter controlled by a common gate electrode 162. Moreover, the output of the inverter formed by the transistors 161C, 171C may be connected to a further N-channel transistor 181C, which may represent a pass gate for a signal provided by the inverter 161C, 171C. Similarly, transistors 171D and 161D may form a further inverter connected to a further pass gate 181D. As previously explained, a respective transistor width, such as 161W or 171W, may be selected, for a given technology node, i.e., a length of the gate 162W, on the basis of the drive current capability required for a proper operation of the memory cell 160 without taking into consideration threshold variations due to the bulk configuration of the transistors used for the memory cell 160. Contrary thereto, a respective configuration formed in the SOI region 150S would require a significant increased chip area, since here the respective transistor width 161W, 171W is significantly increased so as to take into consideration hysteresis effects, thereby requiring a wide drive current range. Consequently, according to the present invention, respective memory areas in the device 100 may be formed within the device region 150B on the basis of a bulk transistor architecture, thereby significantly reducing the required floor space, while, for time-critical circuit blocks, the highly efficient SOI architecture may be employed.

With reference to FIGS. 2a-2d, further illustrative embodiments will now be described in more detail, in which additional process techniques are described so as to significantly relax the requirements in view of selectivity of an epitaxial growth process or to substantially avoid an epitaxial growth process.

Figure 2A:
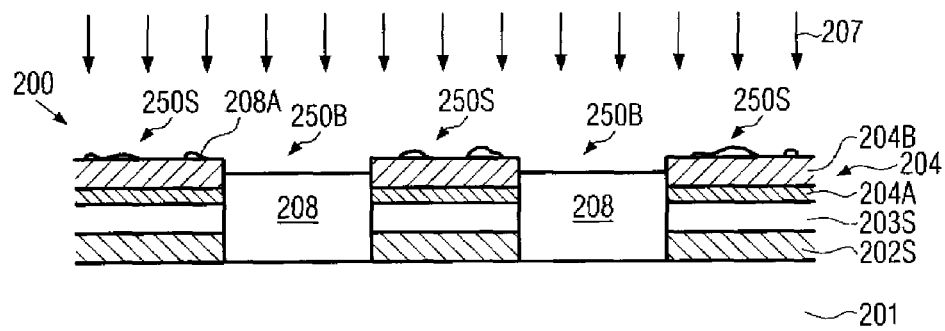
FIGS. 2a-2d schematically illustrate cross-sectional views during the formation of first and second crystalline semiconductor regions for SOI devices and bulk devices, respectively, in which additional material removal processes, such as chemical mechanical polishing (CMP), may be used according to other illustrative embodiments.

FIG. 2a schematically illustrates a semiconductor device 200 at an early manufacturing stage, which may comprise a substrate 201 including at least, in an upper portion thereof, a substantially crystalline semiconductor material, which may be used as a crystal template for the subsequent processing of the device 200. With respect to the characteristics of the substrate 201, the same criteria may apply as previously explained with reference to the substrate 101. Moreover, respective SOI regions 250S and corresponding bulk regions 250B may be formed in the device 200 in accordance with device and design requirements. That is, depending on the complexity of hysteresis sensitive circuit blocks, the size and number of the respective bulk regions 250B may be correspondingly adapted, while the size and number of the respective SOI regions 250S may be selected in conformity with respective time-critical circuit blocks. Hence, the lateral sizes of the regions 250S, 250B may range from several tens of micrometers to one hundred or several hundreds of micrometers. Similarly, as is described for the device 100, in the respective SOI regions 250S, a stack of layers may be provided which may include a buried insulating layer 202S, a first crystalline semiconductor region 203S and a mask 204. Moreover, respective second crystalline semiconductor regions 208 may be formed within the respective bulk regions 250B, wherein the crystalline characteristics of the region 208 may be the same or may differ compared to the characteristics of the region 203S, as is also previously explained with reference to the regions 103S and 108.

The device 200 as shown in FIG. 2a may be formed on the basis of substantially the same process techniques as are previously described with reference to the device 100. Hence, after patterning respective layers for providing the layer stack in the regions 250S on the basis of techniques previously described, an epitaxial growth process 207 may be performed, wherein, depending on the dimensions of the regions 250S, the selectivity for material deposition may be reduced, thereby also depositing more or less continuous material portions 208A on the mask 204. Consequently, in order to relax the requirements with respect to selectivity of the epitaxial growth process 207, a certain amount of material deposition in the form of the residues 208A may be taken into consideration by performing an additional material removal process, for instance on the basis of a selective etch process and/or a CMP process. In some illustrative embodiments, the material for the regions 208 may be formed during the growth process 207 with an excess height, which may be subsequently removed by a selective etch process, thereby also removing the residues 208A from the corresponding masks 204 in order to provide a highly uniform removal process for the masks 204 in a subsequent process step, as is also, for instance, described with reference to the device 100. In other illustrative embodiments, the removal of the residues 208A may be accomplished on the basis of a CMP process, wherein, in some illustrative embodiments, the mask 204 may comprise a stop layer 204A, which may allow reliable control of the corresponding CMP process, when the material of the region 208 and the mask 204 may have different removal rates. For instance, in some embodiments, the mask 204 may have an upper portion 204B, for instance comprised of silicon dioxide, while the stop layer 204A may be comprised of silicon nitride. Hence, during a polishing process, the residues 208A may be efficiently removed and the portion 204B may also be efficiently polished, wherein the removal rate in the regions 250B may be reduced due to an increased hardness compared to the material of the layer 204B. Consequently, after substantially completely removing the portion 204B, the stop layer 204A may provide a significantly reduced polishing rate at the regions 250S while the material in the region 250B is readily polished to a substantially planar surface configuration.

Figure 2B:
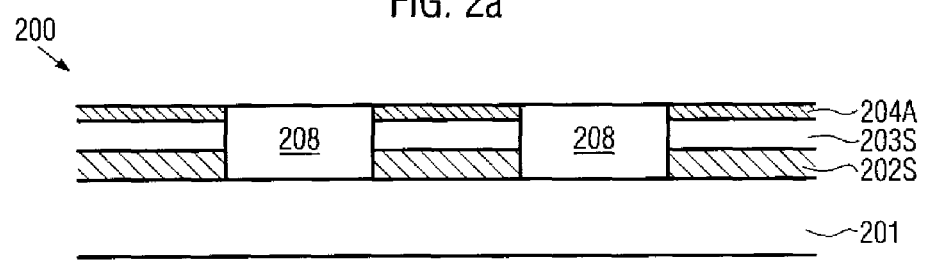

FIG. 2b schematically illustrates the semiconductor device 200 after the completion of the above-described process sequence. Hence, a substantially planar surface topography may be obtained, wherein the residue of the stop layer 204A, which may have a relatively small thickness, for instance approximately 5 nm or less, may then be removed on the basis of a selective etch process, as is previously described. Consequently, by introducing an additional material removal process, such as an additional etch process, a CMP process or a combination thereof, the constraints with respect to selectivity of the etch process 207, as well as with respect to deposition uniformity across the entire substrate 201, may be significantly relaxed, since the finally obtained height level of the regions 208 and thus of the finally obtained surface planarity may be determined by highly controllable deposition processes, such as corresponding deposition recipes for forming the stop layer 204, including the portions 204A and 204B. In this way, an increased degree of non-uniformity during the cavity etch process may be tolerated. Moreover, an enhanced flexibility is achieved with respect to process parameters of the deposition process 207 as well as for the selection for appropriate growth mask materials, since any appropriate material may be selected that provides high selectivity during the epitaxial growth process 207 which may not, however, necessarily exhibit a desired high etch selectivity for a subsequent removal on the basis of an etch process.

Figure 2C:
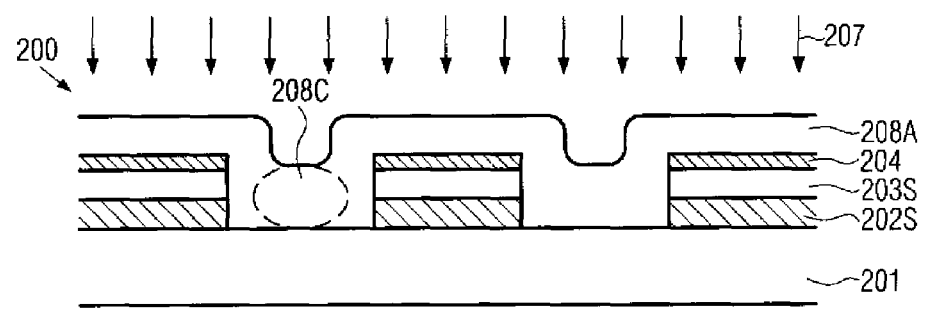

FIG. 2c schematically shows the device 200 according to a further illustrative embodiment, wherein the deposition process 207 may be designed as an epitaxial process with significantly reduced selectivity or non-selectivity with respect to the mask 204. Consequently, the layer 208A may be formed by the process 207, wherein at least a central portion 208C within the regions 250B may have a substantially crystalline structure according to the template of the substrate 201. In still other illustrative embodiments, the layer 208A may be deposited as a substantially amorphous layer irrespective of whether or not the layer 208A as deposited may include crystalline portions, a thickness thereof being selected so as to fill the recesses in the regions 250B to a desired height. Thereafter, a CMP process may be performed in order to planarize the surface topography of the layer 208A, wherein, in some illustrative embodiments, the layer 208A may be substantially completely removed from the respective mask layers 204, which may now act as a CMP stop layer, as previously explained.

Figure 2D:
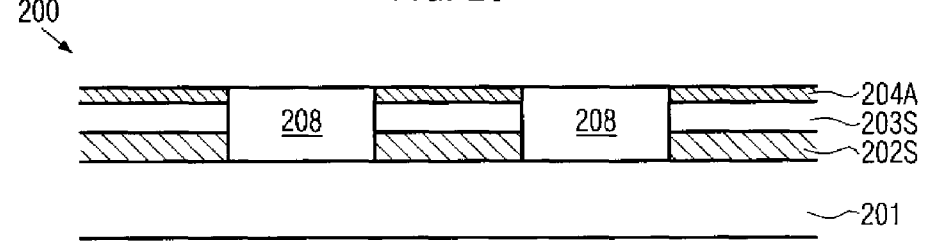

FIG. 2d schematically illustrates the semiconductor device 200 after the completion of the above-described process sequence. Hence, the device comprises the semiconductor region 208 with a substantially planar surface configuration with respect to the regions 250S, wherein the semiconductor regions 208 may be substantially completely amorphous, poly-crystalline, or may include the crystalline portion 208C. Thereafter, the mask layer 204 may be removed on the basis of a selective etch process, wherein, prior to or after the removal of the mask layer 204, an appropriately designed annealing process may be performed in order to re-crystallize the regions 208 using the substrate 201 or a portion thereof as a crystal template. For instance, a heat treatment at temperatures of approximately 600-1100° C. may be used in order to re-crystallize the regions 208. In other illustrative embodiments, laser-based or flash-based anneal techniques may be used to efficiently obtain a corresponding crystalline structure in the regions 208. Thereafter, the further processing may be continued as is also described with reference to FIGS. 1f and 1g, that is, corresponding transistors having an SOI configuration may be formed in and on the semiconductor regions 203S, while corresponding transistors having a bulk configuration may be formed in and on the crystalline regions 208. Consequently, a respective hybrid configuration may be achieved while an enhanced process flexibility with respect to the formation of the bulk regions 250B, when starting from an SOI substrate, may be accomplished.

Figure 3A:
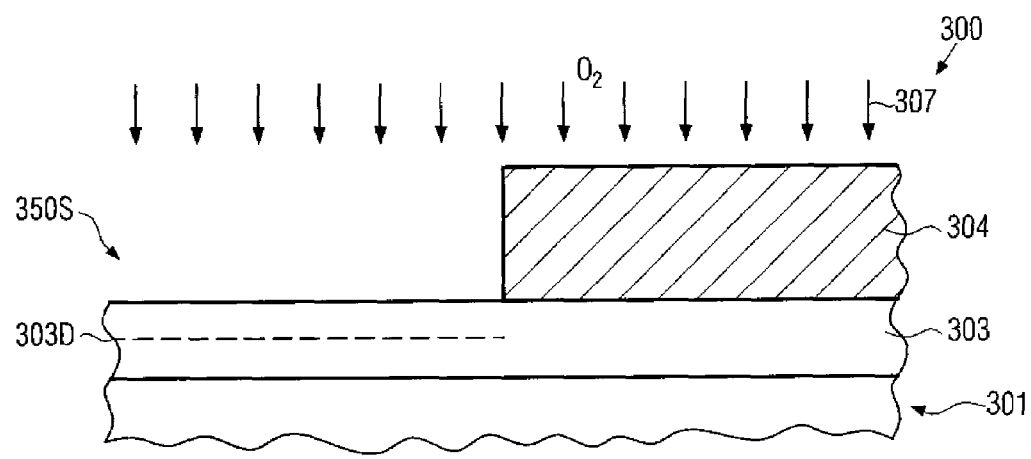
FIGS. 3a-3b schematically illustrate cross-sectional views of the formation of SOI regions and bulk regions on the basis of an implantation process according to yet other illustrative embodiments.
Figure 3B:
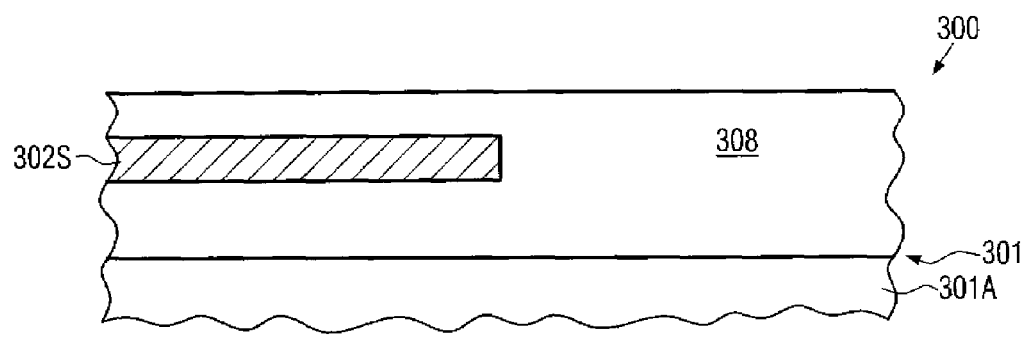

With reference to FIGS. 3a and 3b, further illustrative embodiments will be described in which respective SOI regions and bulk regions may be formed on the basis of advanced implantation techniques.

FIG. 3a schematically illustrates a semiconductor device 300 comprising a substrate 301, which includes a crystalline semiconductor layer 303, above which is formed a mask layer 304. The substrate 301 may represent any appropriate carrier material for supporting the crystalline semiconductor layer 303. Moreover, the mask layer 304 may be formed of any appropriate material having characteristics to act as an implantation mask and to withstand the environmental conditions, such as high temperature, during an advanced implantation process 307 for introducing a specified atomic species, such as oxygen, into a specified depth indicated as 303D.

The semiconductor device 300 as shown in FIG. 3a may be formed on the basis of the following processes. The substrate 301 including the crystalline semiconductor layer 303 may be obtained from substrate manufacturers or may be formed on the basis of well-established techniques. Thereafter, the mask 304, which may include any etch stop layers and the like, may be formed on the basis of well-established deposition and etch techniques on the basis of photolithography. For instance, the mask 304 may be comprised of silicon dioxide, silicon nitride and the like. After the patterning of the mask 304, which exposes an SOI region 350S, the process 307 may be performed on the basis of the mask 304. In some illustrative embodiments, the process 307 may represent a SIMOX (separation by implantation of oxygen) process to locally form a buried insulating layer in the region 350S. The SIMOX technique, which may be conventionally employed for forming entire SOI substrates, is based on a specific implantation technique for introducing oxygen to a specified depth, i.e., to the depth 303D, without substantially amorphizing the overlying crystalline region of the layer 303. This may be accomplished by performing the oxygen implantation at elevated temperatures, such as approximately 400-600° C., so that implantation-induced damage is immediately repaired, at least to a certain degree, so that, even after the required high dose implantation, the damaged semiconductor region above the implanted oxygen, concentrated around the depth 303D, may be substantially re-crystallized during an anneal cycle during which a buried insulating layer, i.e., an oxide layer, is formed. The introduction of the high oxygen concentration, for instance requiring a dose of approximately $10^{18}$ ions/cm$^2$ may be accomplished by modern SIMOX implanters providing a high beam current at moderately high uniformity across the substrate 301.

FIG. 3b schematically illustrates the semiconductor device 300 after the removal of the mask 304 and respective heat treatment so as to form a buried insulating layer 302S within the semiconductor layer 303 in the SOI region 350S. Hence, the device 300 comprises a first crystalline semiconductor region 303S formed on the buried insulating layer 302S and also a second semiconductor region 308, which represents the residual of the semiconductor layer 303. Then, further processing may be continued on the basis of process techniques as are previously described with reference to FIGS. 1f and 1g. That is, corresponding SOI transistors may be formed in and on the region 303S, while corresponding bulk devices for memory areas may be formed in and on the regions 308.

Figure 4A:
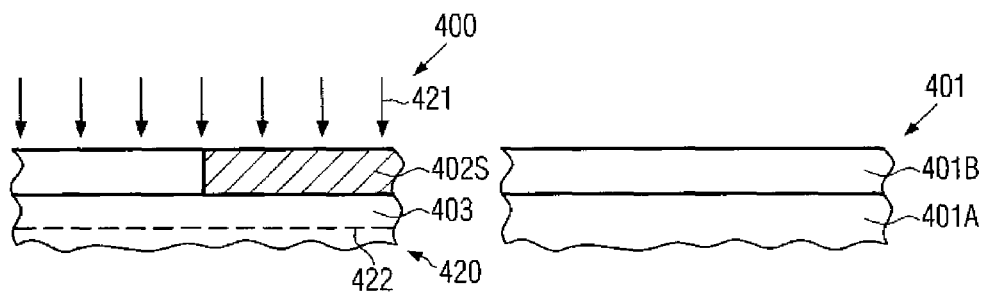
FIGS. 4a-4c schematically illustrate cross-sectional views of a substrate and a donor substrate for forming corresponding SOI regions and bulk regions on the substrate according to yet other illustrative embodiments of the present invention.
Figure 4B:
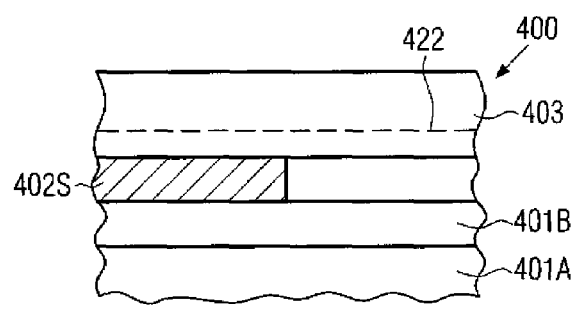
Figure 4C:
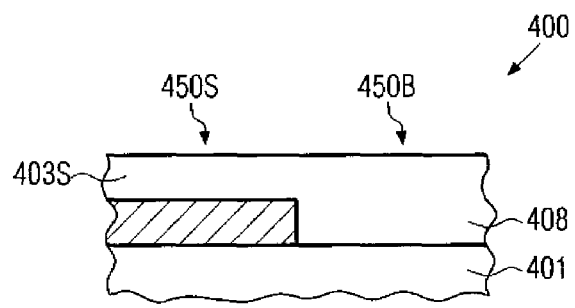

With reference to FIGS. 4a-4c, further illustrative embodiments of the present invention will be described, in which wafer bonding techniques may be used for forming a plurality of SOI regions and bulk regions for the fabrication of respective transistors therein according to other illustrative embodiments of the present invention.

FIG. 4a schematically illustrates a substrate 401, which may comprise a carrier portion 401A and an upper portion 401B, which may be comprised of any appropriate material, such as an insulating material, such as silicon dioxide, or a semiconductor material, such as silicon, and the like. Moreover, a semiconductor device 400 is shown including a donator substrate 420, which may be provided in the form of a bulk semiconductor substrate, such as a silicon substrate or any other carrier material having formed thereon a crystalline semiconductor layer 403. Moreover, a portion of the semiconductor layer 403 is replaced by an insulating layer 402S, which may be comprised of any appropriate insulating material, such as silicon dioxide, silicon nitride and the like, as may be required for the formation of an SOI region. Moreover, a light atomic species 422, such as hydrogen and/or helium, which may have been implanted by a correspondingly designed implantation process 421, may be formed within the layer 403 at a specified depth.

The semiconductor device 400 as shown in FIG. 4a may be formed according to the following processes. After providing the donator substrate 420 comprising the semiconductor layer 403, the implantation process 421 may be performed to position the light atomic species 422 at the appropriate depth on the basis of well-established implantation techniques. Thereafter, an etch mask (not shown) may be formed above the layer 403 so as to expose a portion of the layer 403 corresponding to the insulating layer 402S. Thereafter, a corresponding etch process may be performed in order to remove material of the layer 403 up to a desired depth, and subsequently insulating material may be deposited, for instance by appropriate CVD techniques, wherein, depending on the process parameters, a highly non-conformal deposition process may be obtained. Thereafter, excess material of the insulating material may be removed, for instance by CMP, so as to finally expose the material of the layer 403 adjacent to the insulating layer 402S. In other illustrative embodiments, appropriate CMP stop layers may be formed prior to the deposition of the insulating material, or even prior to the patterning of the layer 403 to provide a highly planar surface topography after the removal of the excess material of the insulating material for forming the insulating layer 402S.

FIG. 4b schematically illustrates the semiconductor device 400 combined with the substrate 401 in a further advanced manufacturing stage, that is, after bonding the semiconductor device 400 with the layer 403 to the substrate 401, i.e., the layer portion 401B. For this purpose, a temperature, for instance in the range of approximately 800-1100° C., and a high pressure, as in conventional wafer bond techniques, may be applied in order to firmly connect the device 400 and the substrate 401. Prior to, after or during the bond process, the atomic species 422 may be heat treated to form irregularities or "bubbles" in order to define a cleavage plane in the layer 403 for removing the rest of the layer 403 in a subsequent cleavage process, for instance based on high pressure water jets and the like, for which well-established techniques are established in the art. In other illustrative embodiments, residual material of the layer 403 may be removed by a grinding or polishing or etch process. In this case, the atomic species 422 introduced to a specific depth may be used for controlling the respective material removal processes.

FIG. 4c schematically illustrates the device 400 after the completion of the above-described process sequence. Hence, the device 400 comprises an SOI region 450S including a crystalline region 403S formed on the buried insulating layer 402S and also comprises a bulk region 450B with a crystalline region 408. Hence, effective high speed SOI transistors for respective functional logic blocks, such as CPU cores and the like, may be formed within the one or more SOI regions 450S, while bulk transistors may be formed in the respective bulk regions 450B, thereby providing the potential for forming complex memory areas in a space-efficient manner, as is also previously described with reference to FIGS. 1f and 1g.

As a result, the present invention provides a technique that enables the integration of bulk transistor architectures, for instance, for complex SRAM areas in an otherwise SOI circuitry having the benefit of fast switching speed, while the bulk SRAM area provides significant area savings due to the elimination of hysteresis effects in the memory areas. This may be accomplished in some illustrative embodiments by starting with an SOI substrate and forming locally respective bulk areas in the substrate by means of a selective epitaxial growth technique. In still other illustrative embodiments, less complex deposition techniques, such as non-selective epitaxial growth, deposition of amorphous or polycrystalline materials, may be used in combination with additional material removal processes in order to provide enhanced process flexibility. In still other illustrative embodiments, advanced implantation techniques and wafer bond techniques may be used for locally forming respective SOI regions and bulk regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   implanting an atomic species into a surface layer of a donator substrate to a specified depth;
   forming a crystalline portion and an insulating portion laterally adjacent one another in said surface layer of crystalline semiconductor material of a donator substrate above said specific depth;
   bonding said surface layer of said donator substrate to a substrate, the surface layer including coplanar exposed portions of said insulating portion and said crystalline portion;
   removing excess material of said donator substrate using said atomic species located at said specified depth to control the removal of said excess material so as to a maintain a portion of said crystalline semiconductor material on said insulating portion to define an SOI region and to define a bulk region in said crystalline portion;
   forming a first plurality of transistors of an electronic circuit in said SOI region; and
   forming a second plurality of transistors of said electronic circuit in said bulk region.

2. The method of claim 1, wherein said excess material is removed by cleaving said donator substrate.

3. The method of claim 1, wherein said insulating portion is formed by forming a recess in said surface layer and filling said recess with an insulating material.

4. The method of claim 1, wherein at least some of said second plurality of transistors are formed so as to define a memory cell.

5. A method, comprising:
   forming a first plurality of transistors of an electronic circuit in an SOI region formed on a substrate, wherein said first plurality of transistors comprises isolated transistor bodies, at least some of said first plurality of transistors form a first inverter, and said transistors of said first inverter have a first transistor width; and
   forming a second plurality of transistors of said electronic circuit in a bulk region formed on said substrate, wherein at least some of said second plurality of transistors form a second inverter and said transistors of said second inverter have a second transistor width less than said first inverter width, wherein forming said first and second pluralities of transistors comprises implanting an atomic species into a surface layer of a donator substrate to a specified depth, forming a crystalline portion and an insulating portion laterally adjacent in a surface layer of a donator substrate, bonding said donator substrate with said surface layer to said substrate, said surface layer including coplanar exposed portions of said insulating portion and said crystalline portion, and removing excess material of said donator substrate using said atomic species located at said specified depth to control the removal of said excess material so as to maintain material as said SOI region on said insulating portion and to use said crystalline portion as said bulk region.

6. The method of claim 5, wherein said excess material is removed by cleaving said donator substrate.

7. The method of claim 5, wherein said insulating portion is formed by forming a recess in said surface layer and filling said recess with an insulating material.

* * * * *